United States Patent [19]

Hancock

[11] Patent Number: 5,497,082

[45] Date of Patent: Mar. 5, 1996

[54] QUADRATURE DETECTOR WITH A HALL EFFECT ELEMENT AND A MAGNETORESISTIVE ELEMENT

[75] Inventor: Peter G. Hancock, Plano, United Kingdom

[73] Assignee: Honeywell Inc., Minneapolis, Minn.

[21] Appl. No.: 377,871

[22] Filed: Jan. 25, 1995

[51] Int. Cl.$^6$ .......................... G01B 7/14; G01R 33/02; G01R 33/12; G01P 3/42

[52] U.S. Cl. .................. 324/207.14; 324/207.2; 324/207.21

[58] Field of Search .................. 324/207.2, 207.21, 324/207.14, 207.24, 207.25; 338/32 R, 32 H; 327/510, 511

[56] References Cited

U.S. PATENT DOCUMENTS

| | | |
|---|---|---|
| 3,824,455 | 7/1974 | Levitt et al. .......................... 324/207.2 |
| 4,810,967 | 3/1989 | Yokoyama et al. . |
| 4,897,914 | 2/1990 | Loubier . |
| 5,019,776 | 5/1991 | Kawamata et al. . |
| 5,041,785 | 8/1991 | Bogaerts et al. . |

*Primary Examiner*—Walter E. Snow
*Attorney, Agent, or Firm*—William D. Lanyi

[57] ABSTRACT

A position sensor is provided with the capability of detecting a quadrature signal by the provision of first and second magnetically sensitive devices. The first magnetically sensitive device comprises a Hall effect element or some other device which is capable of sensing strength of a component of a magnetic field which is perpendicular to a preselected plane. A second magnetically sensitive device is provided which is capable of sensing the component of a magnetic field lying in the same plane. In a preferred embodiment, the first magnetically sensitive device is a Hall effect element and the second magnetically sensitive device comprises at least one magnetoresistor. The first and second magnetically sensitive devices are disposed on a common substrate and arranged to have a common geometric center. When the device is associated with a moving target that comprises a plurality of magnetized regions, accurate determination is possible with respect to both the rate of movement and the direction of movement of the target.

12 Claims, 6 Drawing Sheets

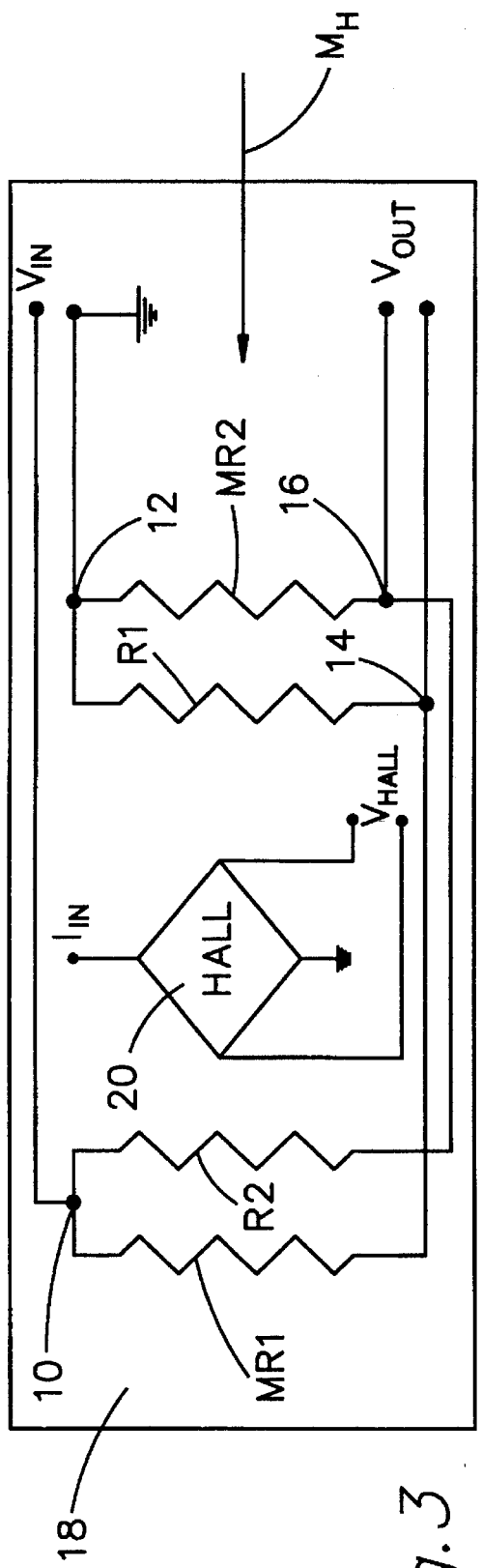
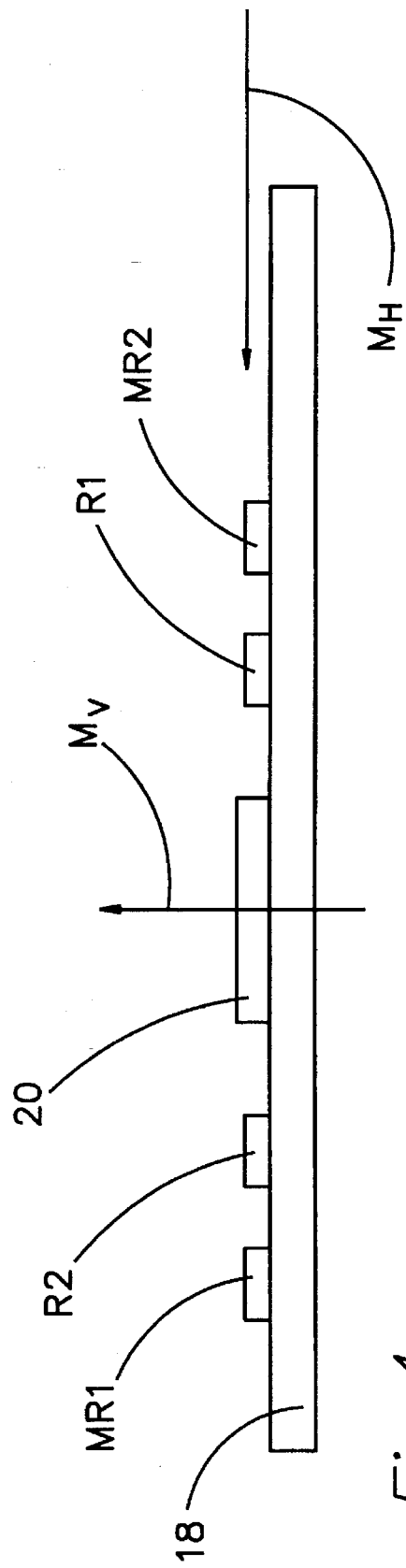
Fig. 3
Fig. 4

5,497,082

QUADRATURE DETECTOR WITH A HALL EFFECT ELEMENT AND A MAGNETORESISTIVE ELEMENT

BACKGROUND OF THE INVENTION

1. Field of the Invention

The present invention relates generally to position detectors and, more particularly, to a position detector that comprises two magnetically sensitive devices which combine to provide quadrature sensing.

2. Description of the Prior Art

Many different types of position sensors are known to those skilled in the art, Some position sensors are intended to detect the movement of a target along a linear path while others detect the rotation of a target, such as a gear with a plurality of teeth, about an axis of rotation. The target and sensor can be arranged so that the target is provided with a plurality of magnetic poles that are sensed by a magnetically sensitive component. Alternatively, the sensor may be provided with a biasing magnet and the target can comprise a plurality of ferromagnetic discontinuities, such as gear teeth, that are sensed by the device.

It is also known to those skilled in the art to utilize two magnetically sensitive devices together for the purpose of determining the position and movement of a target. U.S. Pat. No. 5,041,785, which issued to Bogaerts et al on Aug. 20, 1991, discloses a device for measuring a relative displacement of two objects, including a magnetic scale and two mutually perpendicular magnetic sensors which produce two independent phase displaced signals. The device comprises an elongate scale consisting of a succession of magnetic north poles and south poles. It also comprises a measuring head with at least a first and a second magnetic field sensor that are subjected to the effect of a magnetic field which alternates as a function of time due to the alternating passage of north poles and south poles during a displacement of the scale in its longitudinal direction with respect to the measuring head.

U.S. Pat. No. 5,019,776, which issued to Kawamata et al on May 28, 1991, describes a magnetic position detection apparatus that magnetically detects a positional relation between first and second members. It comprises a magnetic recording medium carried on the first member at a magnetic sensor substrate supported by the second member. Two or more tracks each including a multiplicity of magnetic poles arranged at a predetermined pitch are provided on the magnetic recording medium.

U.S. Pat. No. 4,897,914, which issued to Loubier on Feb. 6, 1990, discloses a method of making a magnetic encoding device having Hall effect devices. The method achieves reproducibility by forming a frame of the encoder as a unitary, or one piece, arrangement for both supporting a shaft bearing and an angular behavior sensor such as a Hall effect switch. It therefore controls tolerances, air gaps and angular orientation of the sensor. Calibration of such a sensor to compensate for manufacturing variability in the Hall sensing device as well as any other variabilities in the encoder is then achieved by providing a reversible calibrating magnetic field close to the Hall effect switch and then moving the magnetic field until the desired switch calibration is achieved.

U.S. Pat. No. 4,810,967, which issued to Yokoyama et al on Mar. 7, 1989, describes a position sensor for detecting angular position. It includes a light, compact angle-of-rotation sensor which comprises a magnetic ring bonded to a shaft by means of resin. The magnetic ring is provided around its periphery with a number of magnetized zones, with each magnetized zone having a different number of magnetic poles. Magnetic interference between magnetized zones is prevented by leaving nonmagnetized spaces between the magnetized zone. The prevention of magnetic interference can be further enhanced by the provision of nonmagnetized portions between the magnetized poles of the magnetized zones.

In certain applications where devices of this type are intended to detect the rotation of a rotatable target, it is necessary to detect both the rate of rotation of the target and the direction of rotation. If the target suddenly reverses direction, the sensor must be able to detect that reversal. This type of sensor can find utilization in automatic braking systems and other systems wherein both speed and direction of rotation of a target must be determined.

Quadrature sensing is well known to those skilled in the art. It involves the use of two signals which are offset from each other by 90 degrees so that a comparison of the signals will provide meaningful information with regard to the position of a target. U.S. Pat. No. 5,041,785, described above, utilizes two magnetoresistive elements in association with each other to provide signals of this type.

SUMMARY OF THE INVENTION

A quadrature detector made in accordance with the preferred embodiment of the present invention comprises a first magnetically sensitive device and a second magnetically device. The first magnetically sensitive device is disposed on a first surface of a substrate in order to sense a first directional component of a magnetic field. The second magnetically sensitive device is disposed on the first surface of the substrate to sense a second directional component of the magnetic field. The first and second directional components of the magnetic field are perpendicular to each other. The first directional component in perpendicular to the first surface of the substrate and the second directional component is parallel to the first surface of the substrate. In a particularly preferred embodiment of the present invention, the first magnetically sensitive device comprises a Hall effect element and the second magnetically sensitive device comprises a magnetoresistive element.

In one embodiment of the present invention, the second magnetically sensitive device comprises two magnetoresistors that are connected in a Wheatstone bridge configuration with two other resistors. The first and second magnetically sensitive devices can be disposed on a common geometric center. In a most preferred embodiment of the present invention, the Hall effect element and the magnetoresistors are arranged in such a way that they have a common geometric center.

In a preferred embodiment of the present invention, a means for providing a first signal that is representative of the first directional component of the magnetic field and a second means for providing a second signal that is representative of the second directional component of the magnetic field are included. In addition, the present invention provides a means for comparing the first and second signals to each other.

Because of the arrangement of the first and second magnetically sensitive devices around a common geometric center, both devices will be responsive to changes in the magnetic field at the same point in space. This is particularly important in applications where manufacturing tolerances may result in the positioning of the sensor relative to the rotating target. If the two magnetically sensitive devices are arranged so that they are actually sensing the magnetic field at different locations, the position of the sensor relative to the target is critical and significant care must be taken to assure that the sensor is placed accurately in position relative to the target. Although proper positioning of the sensor relative to the target is always a goal, errors in positioning do not have the significantly disadvantageous effect that they would in sensors that do not utilize the concepts of the present invention.

BRIEF DESCRIPTION OF THE DRAWINGS

The present invention will be more fully and completely understood from a reading of the Description of the Preferred Embodiment in conjunction with the drawings, in which:

FIG. 3 illustrates first and second magnetically sensitive devices disposed on a substrate;

FIG. 4 is a side view of the device shown in FIG. 3;

DESCRIPTION OF THE PREFERRED EMBODIMENT

Figures 1, 2:
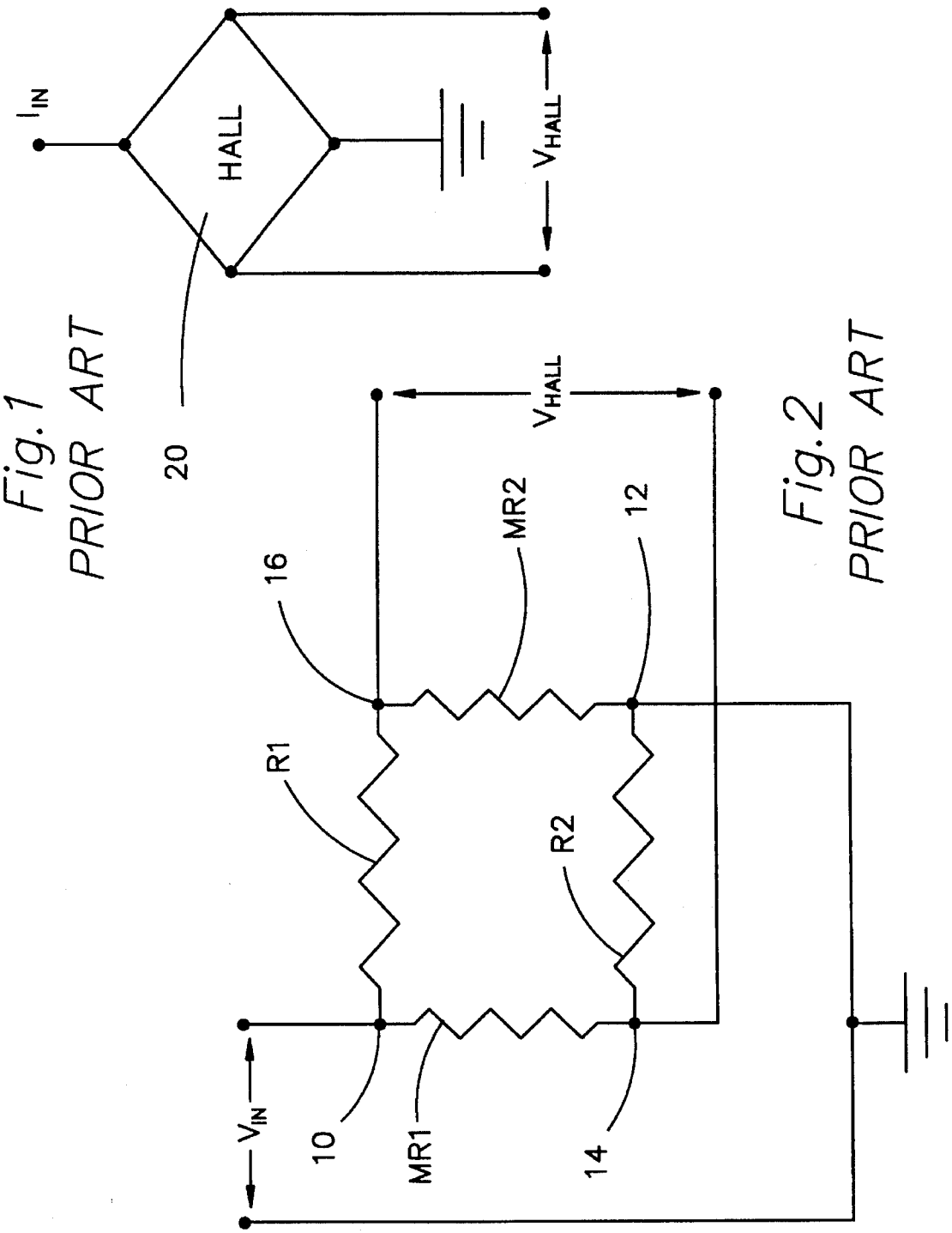
FIG. 1 illustrates a Hall effect element.
FIG. 2 illustrates a Wheatstone bridge comprising two magnetoresistors.

Throughout the Description of the Preferred Embodiment, like reference numerals will be used to identify like components. FIG. 1 illustrates a Hall element 20. As is well known to those skilled in the art, the Hall effect permits the measurement of changes in a voltage signal $V_{HALL}$ in response to changes in a magnetic field perpendicular to the Hall element. If a current $I_{IN}$ is provided through the body of a Hall effect element, the voltage potential $V_{HALL}$ across the Hall element is representative of the strength of the magnetic field perpendicular to the Hall element.

Magnetoresistors are devices which experience a change in resistance as a function of the strength of the magnetic field in the plane of the magnetoresistor. Therefore, the resistance of a magnetoresistor can be used to detect changes in a magnetic field in the plane of the magnetoresistor. FIG. 2 illustrates one type of arrangement in which two magnetoresistors, MR1 and MR2, are used to detect changes in a magnetic field. The Wheatstone bridge arrangement of FIG. 2 provides a voltage potential between circuit point 10 and circuit point 12 as shown. One leg of the bridge comprises magnetoresistor MR1 and a standard resistor R2 connected between circuit points 10 and 12. The other leg of the bridge comprises magnetoresistor MR2 and standard resistor R1 connected between circuit points 10 and 12. As can be seen, the series connection of resistor R2 and magnetoresistor MR1 is arranged in parallel association with the series connection of resistor R1 and magnetoresistor MR2. If magnetoresistors MR1 and MR2 are arranged in a common plane, changes in the magnetic field strength parallel to that plane and perpendicular to the magnetoresistors will affect their resistances. Since circuit point 10 is connected to a voltage source $V_{IN}$ and circuit point 12 is connected to ground, an increase in the resistance of magnetoresistors MR1 and MR2 will lower the voltage at circuit point 14 and raise the voltage at circuit point 16. Similarly, a common decrease in the resistance of the magnetoresistors will result in an increase of the voltage at circuit point 14 along with a corresponding decrease in the voltage at circuit point 16. The voltage potential $V_{HALL}$ between circuit points 14 and 16 can therefore be used as a measurement of the magnetic field in the plane of the magnetoresistors MR1 and MR2. The arrangement shown in FIG. 2 is generally known to those skilled in the art and has been used in sensors which incorporate magnetoresistors. Although the bridge shown in FIGS. 2, 3 and 8 combine magnetoresistors, MR1 and MR2, with standard resistors, R1 and R2, it should be understood that four magnetoresistors could also be used. In other words, the standard resistors could be replaced with magnetoresistors. This type of adaptation can provide improved sensitivity.

FIG. 3 illustrates an embodiment of the present invention which provides a substrate 18. On the surface of the substrate 18, the Hall effect element 20 and the magnetoresistive bridge are disposed. As can be seen, the Hall effect element 20 is disposed centrally among the four resistors of the bridge shown in FIG. 2 so that the first magnetically sensitive device (i.e. the Hall effect element 20) and the second magnetically sensitive device (i.e. the magnetoresistive bridge) are disposed on a common geometrical center. The result of this geometric symmetry is that the first and second directional components of the magnetic field at the geometric center, which in this example is located at the center of the Hall effect element 20, will be sensed at approximately the same physical location. In other words, the vertical component $M_V$ of the magnetic field will be sensed at the center of the Hall effect element and perpendicular to the upper surface of the substrate 18 while the horizontal component $M_H$ of the magnetic field will be sensed in the plane of the upper surface of the substrate 18.

With continued reference to FIG. 3, it should be understood that the arrangement of the two magnetoresistors MR1 and MR2, the two other resistors R1 and R2 and the Hall element 20 is exemplary and does not constitute a limitation on the various relative positions between the first and second magnetically sensitive device. In addition, it should be understood that a device made in accordance with the present invention should place the magnetoresistors and the Hall effect element 20 as close together as possible in order to take advantage of the fact that both the first and second magnetically sensitive devices respond to changes in the two components of the magnetic field at the same physical location.

FIG. 4 is a side view of the device shown in FIG. 3. It illustrates the fact that the Hall effect element 20 and the magnetoresistors MR1 and MR2 have a common geometric center. FIG. 4 also illustrates the vertical directional component $M_V$ of the magnetic field which is perpendicular to the upper surface of the substrate 18.

Figure 5:
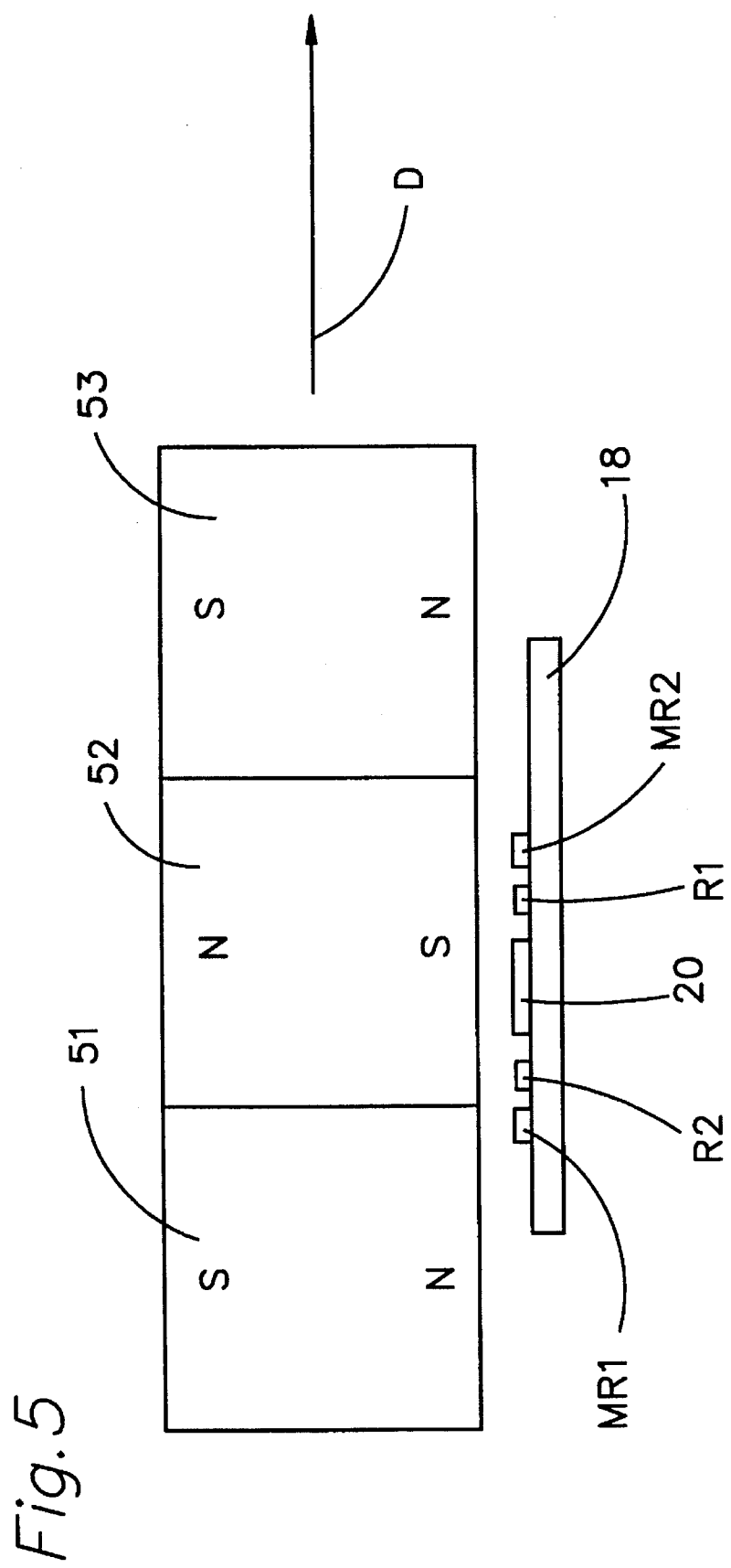
FIG. 5 shows a moveable target of magnetized regions in association with a sensor made in accordance with the present invention.

FIG. 5 shows an exemplary relationship between a sensor made in accordance with the present invention and a moveable target which are intentionally not drawn to scale. The moveable target comprises magnets 51, 52 and 53 which are movable relative to the sensor of the present invention in the direction identified by arrow D. As can be seen, the magnets of the target are arranged in alternating polar relationship.

The geometric center of the sensor sees the effects of a north pole followed by a south pole and then followed again by another north pole as the target moves in the direction represented by arrow D. It should be understood that, although the target in FIG. 5 is illustrated as moving linearly, a rotatable target comprising a plurality of magnets located at its periphery would also provide a suitable target for sensing by the present invention.

Figure 6:
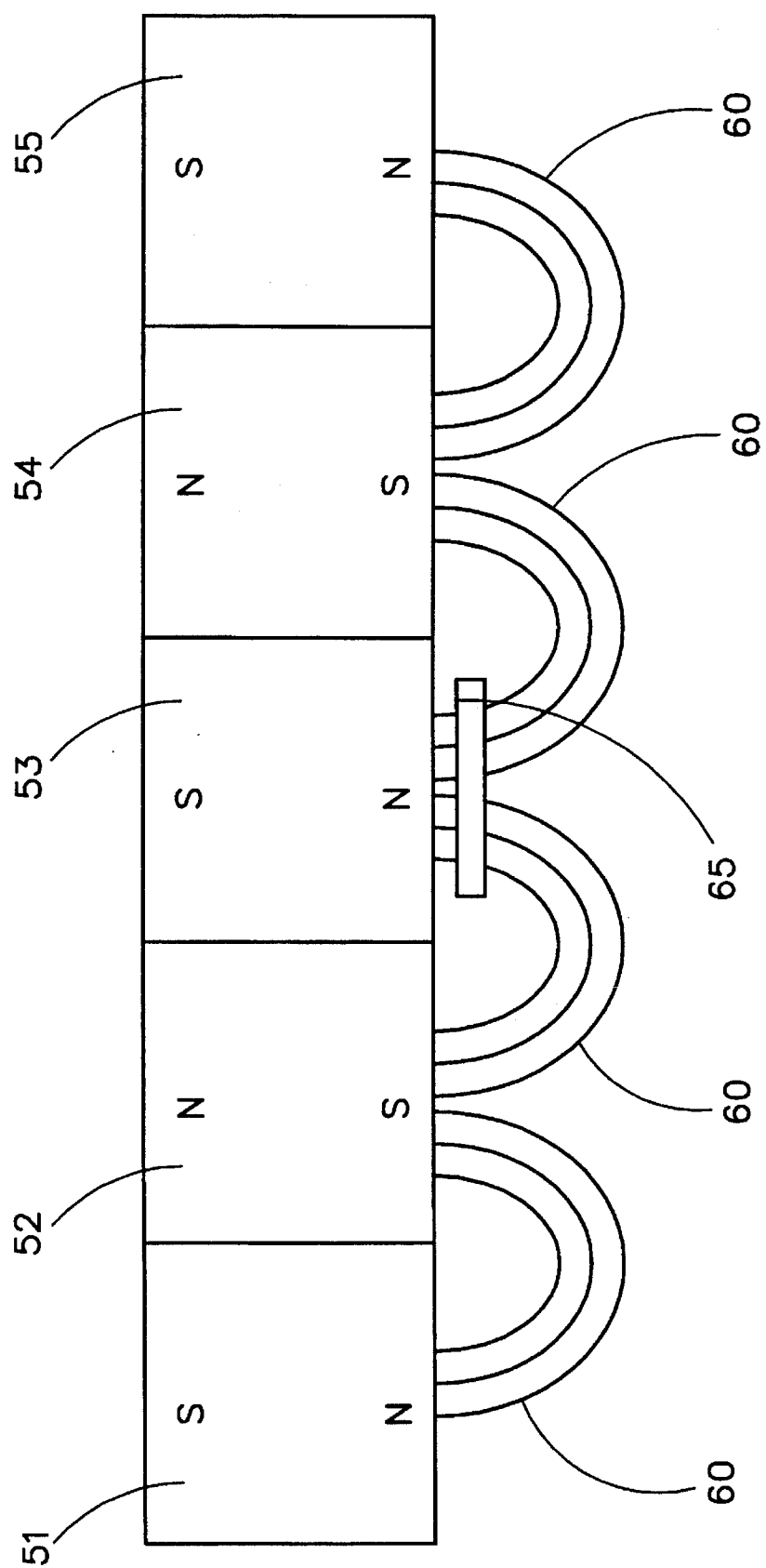
FIG. 6 is similar to FIG. 5 but with the inclusion of lines representing magnetic flux provided by the magnetized regions of the target.

FIG. 6 is similar to the illustration of FIG. 5, but with the addition of lines representing the magnetic fields provided by the plurality of magnets, 51–55, of the moveable target. The lines of magnetic flux 60 illustrate the effect on the first and second magnetically sensitive devices as the target moves past the sensor. It should be understood that the relative sizes of the magnets, 51–55 and the first and second magnetically sensitive devices is highly exaggerated in FIG. 5 and the entire sensor is represented schematically by a simple box in FIG. 6. In actual practice, the first and second magnetically sensitive devices would be much smaller in comparison to the magnets than shown.

With respect to the relative positions between the sensor and the target, it can be seen that the magnetic field is generally perpendicular to the upper surface of the substrate when the geometric center of the sensor 65 is aligned with the center of one of the magnets. At that location, the magnetic field emanates from the pole face of the magnet or into the pole face of the magnet in a generally perpendicular direction to the face. When the magnetic field is essentially perpendicular to the plane of the sensor, the vertical component $M_V$ of the magnetic field is at its maximum value while the horizontal component $M_H$ is at its minimum value. Conversely, when the geometric center of the sensor is aligned with the interface line between two adjacent magnets, the horizontal component $M_H$ of the magnetic field is at its maximum while the vertical component $M_V$ is at its minimum. These relationships alternate as the target moves past the sensor. Since the Hall effect element senses the magnetic field component perpendicular to its plane, it will provide a maximum signal when the geometric center is proximate the center of one of the magnets. Conversely, since the magnetoresistors are sensitive to the magnetic field in the plane of the upper surface of the substrate, they will provide their maximum signal when the geometric center of the sensor is aligned with an interface between two adjacent magnets. The behavior of the first and second magnetically sensitive devices permits the user of the present invention to develop a quadrature signal relationship that can provide significant information about the position and movement of a target. In addition, the arrangement of the Hall effect element 20 and the magnetoresistors also permits the first and second magnetically sensitive devices to be arranged to sense the magnetic field at a preselected geometric center.

Figure 7:
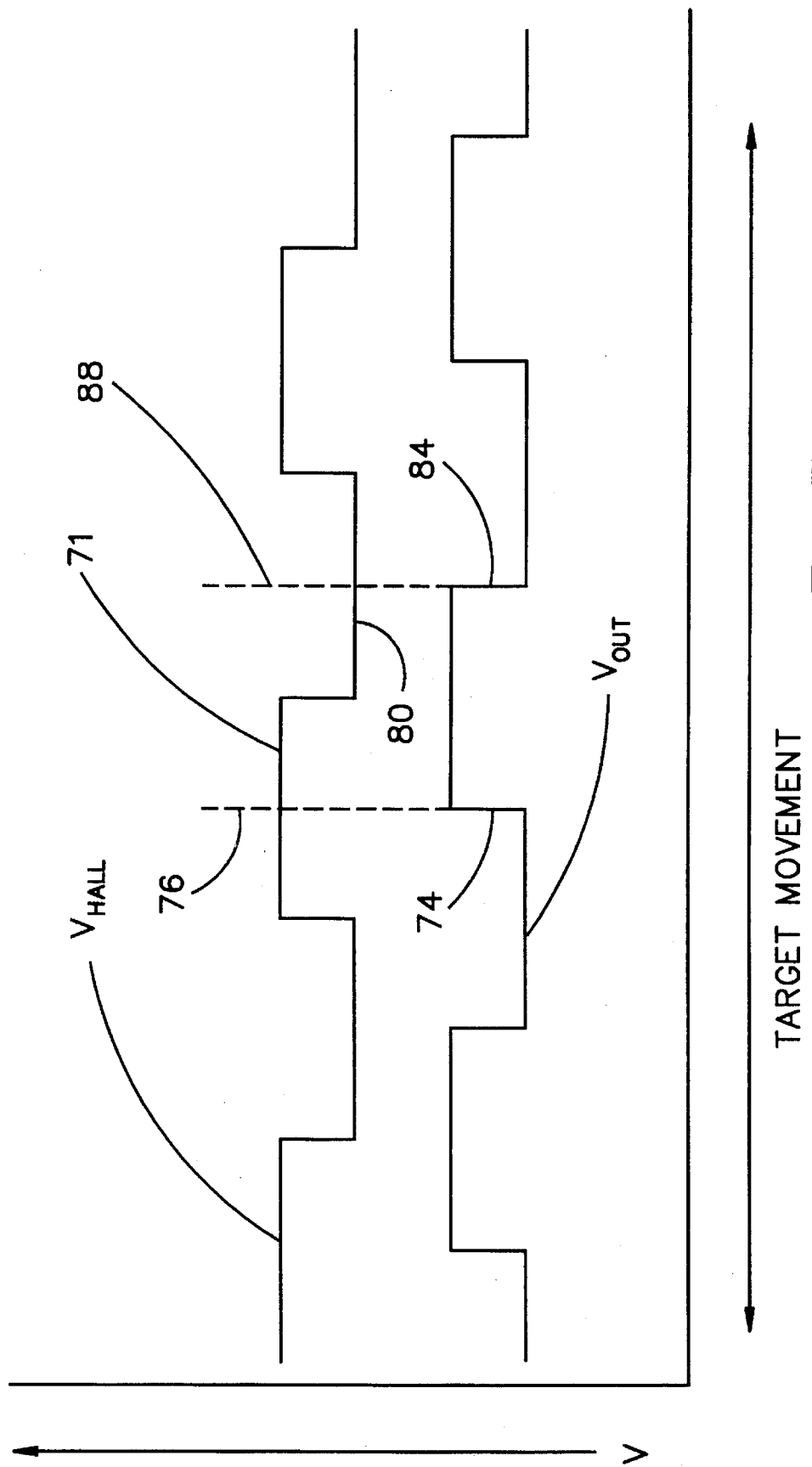
FIG. 7 illustrates the square waves that are provided by the first and second magnetically sensitive devices.

FIG. 7 is a simplified representation of the signals that could be provided by the first and second magnetically sensitive devices. The horizontal axis in FIG. 7 represents the position of the target while the vertical axis in FIG. 7 represents the magnitude of a voltage signal provided by the first and second magnetically sensitive devices. Two square wave signals are shown in FIG. 7. The upper signal is the output $V_{HALL}$ from the Hall effect element and the lower square wave signal is the output $V_{OUT}$ that is provided by the bridge arrangement of magnetoresistors described above. With respect to FIG. 7, it should be understood that the square waves are the result of certain standard circuit operations that condition the raw signals obtained from the Hall effect device 20 and the bridge arrangement of magnetoresistors. For example, it should be understood that the signals from the first and second magnetically sensitive devices would typically be generally sinusoidal in response to movement of the magnet target pass the sensor. Many known techniques are available to compare the magnitudes of the sinusoidal signals to reference values and provide a square wave such as those shown in FIG. 7. In addition, depending on the specific arrangement of the first and second magnetically sensitive devices, the square wave signals shown in FIG. 7 may actually be centered vertically about an offset magnitude which may or may not be zero volts. In addition, it should be understood that the minimum and maximum values of the two square wave signals in FIG. 7 may be identical to each other in many applications of the present invention. However, for purposes of illustration, the two square wave signals are illustrated in FIG. 7 with respect to the X and Y axes in the manner shown. This graphical arrangement allows the square wave signals to be aligned next to each other in order to describe the relationship between their magnitude changes from high to low.

With continued reference to FIG. 7, certain important directional information can be obtained by observing the two square wave signals. For example, if the Hall output voltage $V_{HALL}$ is high and the signal $V_{OUT}$ from the second magnetically sensitive device changes from low to high, the combination indicates that the target is moving from left to right in FIG. 7. This can be deduced from the fact that when $V_{HALL}$ is high, as represented by reference numeral 71, the change in magnitude of signal $V_{OUT}$ during that time is represented by line 74. When the signal rises from a low signal to a high signal along line 74 and the Hall output $V_{HALL}$ is high at that time, it can be deduced that the movement is from left to right. This relationship is represented by dashed line 76. Similarly, when the Hall output $V_{HALL}$ is low, as represented by reference numeral 80, a change in the output signal $V_{OUT}$ of the second magnetically sensitive device, as represented by line 84, from a high signal to a low signal represents movement from left to right. This relationship is identified by dashed line 88.

The concepts relating to quadrature sensing are well known to those skilled in the art. FIG. 7 is intended only to show the way in which the present invention could be used to determine both the position and direction of a moving target that comprises a plurality of magnetized regions.

Figure 8:
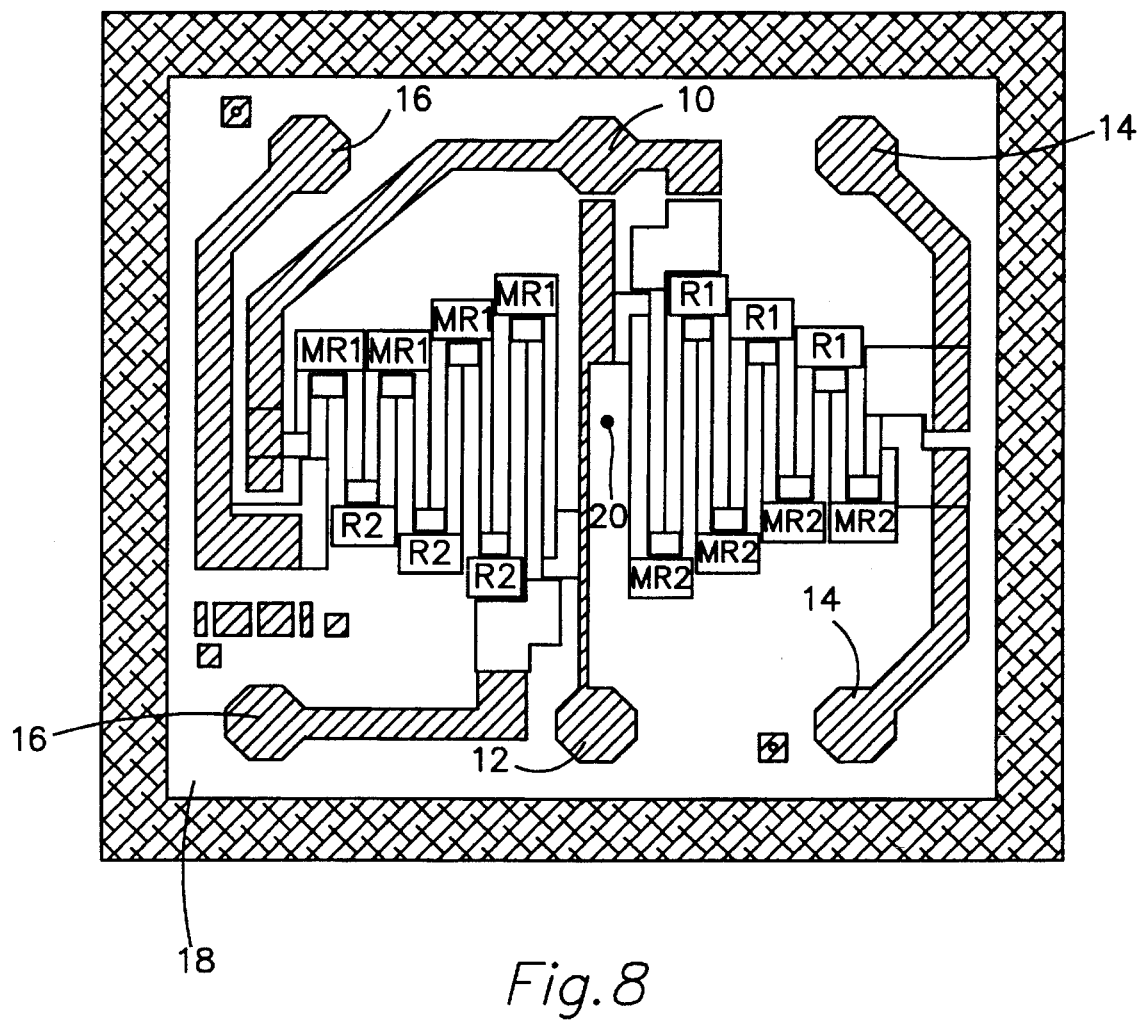
FIG. 8 is one representation of a layout including the first and second magnetically sensitive devices.

FIG. 8 illustrates an arrangement of magnetoresistors that is suitable for use in association with the present invention. As can be seen, magnetoresistor MR1 is arranged in an interleaved nested pattern with resistor R2 while magnetoresistor MR2 is arranged in an interleaved nested pattern with resistor R1. In this particular application, resistors R1 and R2 would not necessarily have to be interleaved in this manner since those resistors are completely unaffected by the presence of a magnetic field. However, the arrangement shown in FIG. 8 has been used to provide a Wheatstone bridge arrangement of four magnetoresistors. The patterns of the resistors shown in FIG. 8 are deposited on a substrate and permit the provision of a relatively small component that contains the four resistors shown in FIGS. 2 and 3. The central point in FIG. 8 is identified by reference numeral 20 and a circular dot. That dot represents the geometric center of the sensor and also represents the location on which a Hall effect element would be disposed. Because of the extremely small size of the typical Hall effect element, its location is represented by a dot and identified by its reference numeral 20. The use of deposited permalloy as the magnetoresistors and the provision of the Hall effect element on the same substrate permits the device to be made in a relatively small size while also maintaining the common geometric center of the two magnetically sensitive devices. Although the pattern shown in FIG. 8 is generally known to those skilled in the art, the inclusion of the Hall effect element 20 at the center of the pattern is not known.

Although the present invention has been described in significant detail and illustrated with particular specificity of describe the most preferred embodiment of the present invention, it should be clearly understood that alternative embodiments are within its scope.

The embodiments of the invention in which an exclusive property or right is claimed are defined as follows:

1. A quadrature detector, comprising:

a first magnetically sensitive device disposed on a first surface of a substrate to sense a first directional component of a magnetic field; and a second magnetically sensitive device disposed on said first surface of said substrate to sense a second directional component of said magnetic field, said first and second directional components of said magnetic field being perpendicular to each other, said first magnetically sensitive device comprising a Hall effect element, said second magnetically sensitive device comprising a magnetoresistive element.

2. The detector of claim 1, wherein:

said first directional component is perpendicular to said first surface of said substrate; and said second directional component is parallel to said first surface of said substrate.

3. The detector of claim 1, wherein:

said second magnetically sensitive device comprises two magnetoresistors connected in a Wheatstone bridge configuration with two other resistors.

4. The detector of claim 3, wherein:

said first and second magnetically sensitive devices are disposed on a common geometric center.

5. The detector of claim 1, further comprising:

first means for providing a first signal that is representative of said first directional component of said magnetic field;

second means for providing a second signal that is representative of said second directional component of said magnetic field; and means for comparing said first and second signals to each other.

6. A quadrature detector, comprising:

a first magnetically sensitive device disposed on a first surface of a substrate to sense a first directional component of a magnetic field; and a second magnetically sensitive device disposed on said first surface of said substrate to sense a second directional component of said magnetic field, said first and second directional components of said magnetic field being perpendicular to each other, said first directional component being perpendicular to said first surface of said substrate, said second directional component being parallel to said first surface of said substrate, said first magnetically sensitive device comprising a Hall effect element, said second magnetically sensitive device comprising a magnetoresistive element.

7. The detector of claim 6, wherein:

said second magnetically sensitive device comprises two magnetoresistors.

8. The detector of claim 8, wherein:

said first and second magnetically sensitive devices are disposed on a common geometric center.

9. A quadrature detector, comprising:

a first magnetically sensitive device disposed on a first surface of a substrate to sense a first directional component of a magnetic field;

a second magnetically sensitive device disposed on said first surface of said substrate to sense a second directional component of said magnetic field, said first and second directional components of said magnetic field being perpendicular to each other, said first directional component being perpendicular to said first surface of said substrate, said second directional component being parallel to said first surface of said substrate;

first means for providing a first signal that is representative of said first directional component of said magnetic field; and second means for providing a second signal that is representative of said second directional component of said magnetic field, said first magnetically sensitive device comprising a Hall effect element, said second magnetically sensitive device comprising a magnetoresistive element.

10. The detector of claim 9, further comprising:

means for comparing said first and second signals to each other.

11. The detector of claim 9, wherein:

said second magnetically sensitive device comprises two magnetoresistors.

12. The detector of claim 9, wherein:

said first and second magnetically sensitive devices are disposed on a common geometric center.

* * * * *